United States Patent
Kushch (10) Patent No.: US 8,927,849 B2
(45) Date of Patent: Jan. 6, 2015

(54) WASTE HEAT THERMOELECTRIC GENERATOR WITH AUXILIARY BURNER

(71) Applicant: Aleksandr Sergey Kushch, Poway, CA (US)

(72) Inventor: Aleksandr Sergey Kushch, Poway, CA (US)

(*) Notice: Subject to any disclaimer, the term of this patent is extended or adjusted under 35 U.S.C. 154(b) by 63 days.

(21) Appl. No.: 13/815,284

(22) Filed: Feb. 15, 2013

(65) Prior Publication Data

US 2014/0230874 A1    Aug. 21, 2014

(51) Int. Cl.
*H01L 35/30* (2006.01)
*H01L 35/28* (2006.01)

(52) U.S. Cl.
CPC ........................ *H01L 35/28* (2013.01)
USPC ............................ 136/207; 136/205

(58) Field of Classification Search
USPC .................................. 136/207, 205
See application file for complete search history.

(56) References Cited

U.S. PATENT DOCUMENTS

| | | | |
|---|---|---|---|
| 5,856,210 A * | 1/1999 | Leavitt et al. | 438/55 |
| 6,019,098 A * | 2/2000 | Bass et al. | 126/344 |
| 6,053,163 A * | 4/2000 | Bass | 126/312 |
| 6,096,964 A * | 8/2000 | Ghamaty et al. | 136/201 |
| 6,096,965 A * | 8/2000 | Ghamaty et al. | 136/201 |
| 6,307,142 B1 * | 10/2001 | Allen et al. | 136/205 |
| 6,519,947 B1 * | 2/2003 | Bass et al. | 62/3.2 |
| 6,527,548 B1 * | 3/2003 | Kushch et al. | 432/222 |
| 6,624,349 B1 * | 9/2003 | Bass | 136/205 |
| 6,828,579 B2 * | 12/2004 | Ghamaty et al. | 257/15 |
| 6,914,343 B2 * | 7/2005 | Hiller et al. | 290/43 |
| 7,012,554 B2 * | 3/2006 | Hiller et al. | 340/988 |
| 7,038,234 B2 * | 5/2006 | Ghamaty et al. | 257/15 |
| 7,342,170 B2 * | 3/2008 | Ghamaty et al. | 136/236.1 |
| 7,400,050 B2 * | 7/2008 | Jovanovic et al. | 290/1 R |
| 7,649,138 B2 * | 1/2010 | Hiller et al. | 136/205 |
| 7,935,882 B2 * | 5/2011 | Pickard et al. | 136/205 |
| 2007/0204850 A1 * | 9/2007 | Pickard et al. | 126/262 |
| 2010/0229911 A1 * | 9/2010 | Leavitt et al. | 136/239 |
| 2011/0062420 A1 * | 3/2011 | Ghamaty et al. | 257/28 |
| 2011/0100408 A1 * | 5/2011 | Kushch et al. | 136/205 |
| 2012/0103381 A1 * | 5/2012 | Leavitt et al. | 136/238 |

* cited by examiner

*Primary Examiner* — Golam Mowla
(74) *Attorney, Agent, or Firm* — John R Ross; John R Ross, III (57) ABSTRACT

A thermoelectric generator utilizing a number of thermoelectric modules to produce electric power from waste heat when waste heat is available and from an alternate heat source when waste heat is not available. In both cases hot gasses are directed along several separate paths so that all of the modules are provided with approximately equal hot side temperatures. In a preferred embodiment the engine exhaust exits into an octagonally-shaped plenum into eight separate heat exchangers. Eight modules are mounted in each of the heat exchangers for a total of 64 modules. Preferred embodiments of the present invention include an auxiliary combustion burner-blower unit producing a hot exhaust that exits into the plenum to provide electric power when the truck is not operating. Valve features are provided to control the temperature and exhaust flow rate through the generator.

14 Claims, 10 Drawing Sheets

FIG. 1
PRIOR ART

PRIOR ART

PRIOR ART

WASTE HEAT THERMOELECTRIC GENERATOR WITH AUXILIARY BURNER

CROSS REFERENCE TO RELATED APPLICATIONS

This application claims the benefit of Provisional Application Ser. No. 61/633,579, filed Feb. 15, 1012.

FIELD OF THE INVENTION

The present invention relates to thermoelectric generators and especially to such generators powered by waste heat or an auxiliary burner.

BACKGROUND OF THE INVENTION

Thermoelectric Materials

The Seebeck coefficient of a thermoelectric material is defined as the open circuit voltage produced between two points on a conductor, where a uniform temperature difference of 1 K exists between those points.

The figure-of-merit of a thermoelectric material is defined as:

$$Z = \frac{\alpha^2 \sigma}{\kappa},$$

where $\alpha$ is the Seebeck coefficient of the material, $\sigma$ is the electrical conductivity of the material and $\kappa$ is the total thermal conductivity of the material.

A large number of semiconductor materials were being investigated by the late 1950's and early 1960's, several of which emerged with Z values significantly higher than in metals or metal alloys. As expected no single compound semiconductor evolved that exhibited a uniformly high figure-of-merit over a wide temperature range, so research focused on developing materials with high figure-of-merit values over relatively narrow temperature ranges. Of the great number of materials investigated, those based on bismuth telluride and lead telluride alloys emerged as the best for operating in various temperature ranges up to 600° C. Much research has been done to improve the thermoelectric properties of the above thermoelectric materials. For example n-type $Bi_2Te_3$ typically contains 5 to 15 percent $Bi_2Se_3$ and p-type $Bi_2Te_3$ typically contains 75 to 80 Mol percent $Sb_2Te_3$. Lead telluride is typically doped with Na and and enriched in Te for P type behavior and for N type behavior the lead telluride is typically doped with iodine and enriched in Pb.

Standard Designations

The temperature at which a thermoelectric alloy is most efficient can usually be shifted to higher or lower temperatures by varying the doping levels and additives. Some of the more common variations with PbTe alloys are designated in the thermoelectric industry as 3N and 2N for N type and 2P and 3P for P type. An in depth discussion of PbTe alloys and their respective doping compositions is given in the book, *Thermoelectric Materials and Devices*, edited by Cadoff and Miller, Chapter 10 "Lead Telluride Alloys and Junctions." For further understanding of $Bi_2Te_3$ based alloys and their doping, see Chapter 9 of the above book and two books edited by D. M. Rowe "*CRC Handbook of Thermoelectrics*, especially Chapter 19 and *Thermoelectrics Handbook*" Macro to Nano, Chapter 27. In this specification and in the claims the term PbTe is meant to include any lead and tellurium semi-conductor alloy when both the lead and tellurium Mol percentage is greater than 20 percent. This includes intrinsic or doped N or P type PbTe, PbSnMnTe and PbSnTe alloys, PbTe doped with Thallium, or $AgTe_2$.

Temperature Ranges for Best Performance

Thermoelectric materials can be divided into three categories: low, mid-range and high temperature.
Low Temperature
Commercially available low-temperature materials normally include $Bi_2Te_3$ alloys. When operated in air, these materials can not exceed 250° C. on a continuous basis without severe deterioration in performance. These alloys are mainly used for cooling although there are a number of waste heat recovery applications based on these $Bi_2Te_3$ alloys. When used as a power source, $Bi_2Te_3$ alloys rarely exceed 5% efficiency.
Mid-Range Temperature
Mid-range materials are normally based on the use of lead telluride, PbTe. PbTe can operate up to about 560° C. Thermoelectric legs comprised primarily of the TAGS group of materials (tellurium, antimony, germanium and silver) provide good performance at about 450° C. Some cobalt based alloys (referred to as skutterudites) are being investigated that also fall into this category but they exhibit high vaporization rates which must be contained for long life. All mid-range thermoelectric alloys known to Applicants will oxidize in air and must be hermetically sealed. Prior art PbTe alloys rarely exceed about 7 percent efficiency. A large number of doping materials are currently being proposed for improvements in performance for all of these mid-range materials.
High-Temperature—Primarily for Space Applications
High-temperature thermoelectric materials are normally based on SiGe and Zintl alloys and can operate near 1,000° C. Modules based on these alloys are difficult to fabricate, expensive and are normally used only in space applications. These prior art high temperature materials can achieve efficiencies as high as 9 percent in some applications, but to date commercial application of these modules has been rare.

Segmented Legs

Segmented thermoelectric legs with mid-temperature to high-temperature materials on the hot side of the leg and a low temperature material on the cold side of the legs can significantly improve performance.

Some of the higher temperature thermoelectric materials tend to experience high free vaporization rates (such as 50% loss in 300 hours). These modules can be sealed in a metal package referred to as a can. The process is called canning. Alternately, one fabricator has contained the material in aerogel insulation in an attempt to suppress the evaporation. In another vapor suppression approach, the sample was coated with 10 μm of titanium. Metal coatings can produce electrical and thermal shorting.

Thermoelectric Modules

Thermoelectric power production is typically accomplished with a number of thermoelectric modules sandwiched between a hot surface and a cold surface. These modules produce electricity directly from a temperature differential utilizing the thermoelectric effect. The modules typically include P-type thermoelectric semiconductor elements and N-type thermoelectric semiconductor elements. These thermoelectric elements are called N legs and P legs. The effect is that a voltage differential of a few millivolts is created in each leg in the presence of a temperature difference of a few hundred degrees. Since the voltage differential is small, many of these legs (such as about 100 legs in each module) are typically positioned side-by-side between the hot surface and the cold surface but are connected electrically in series to produce open circuit potentials of a few volts and power output in the range of a few watts per module. A large number of these modules can be combined to produce power in the kilowatt range from a heat source such as the exhaust system of a truck. Thermoelectric modules are well suited to recover energy from a variety of waste heat applications because they are:

| Small | Easily scaled up or down | Solid state |
|---|---|---|
| Highly reliable | Silent | Potentially cost effective |

Hi-Z Prior Art Bismuth Telluride Molded Egg-Crate Modules

Figure 1:
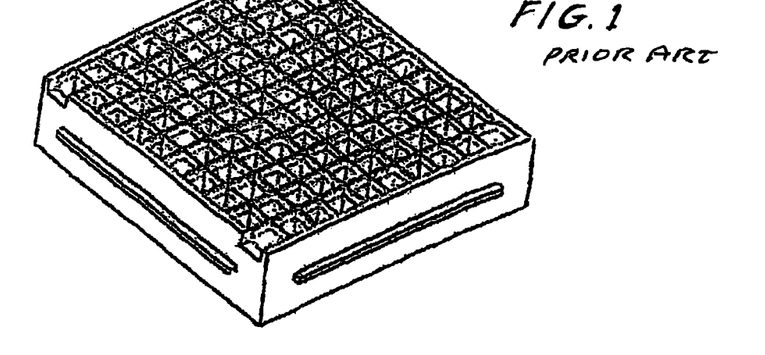
FIG. 1 is a drawing of a thermoelectric egg-crate.
Figures 2, 4:
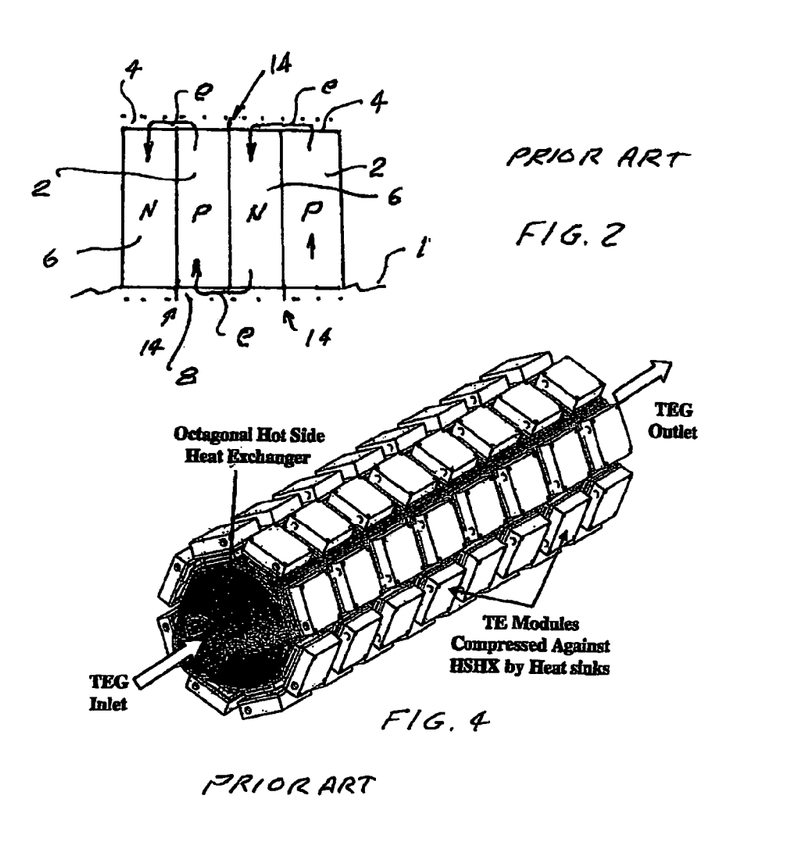
FIG. 2 shows a portion of a thermoelectric egg-crate module.
FIG. 4 is a drawing of a prior art thermoelectric generator.

For example Hi-Z Technology, Inc., with offices in San Diego Calif., offers a Model HZ-14 thermoelectric bismuth telluride thermoelectric module designed to produce about 14 watts at a load potential of 1.66 volts with a 200° C. temperature differential. Its open circuit potential is about 3.5 volts. The module contains 49 N legs and 49 P legs connected electrically in series. It is a 0.5 cm thick square module with 6.27 cm sides. The legs are P-type and N-type bismuth telluride semiconductor legs and are positioned in an egg-crate type structure that insulates the legs from each other except where they are intentionally connected in series at the top and bottom surfaces of the module. That egg-crate structure which has spaces for the 98 active legs is described in U.S. Pat. No. 5,875,098 which is hereby incorporated herein by reference. The egg-crate is injection molded in a process described in detail in the '098 patent. This egg-crate has greatly reduced the fabrication cost of these modules and improved performance for reasons explained in the patent. FIG. 1 is a drawing of the egg-crate and FIG. 2 is a cross sectional drawing of a portion of the egg-crate showing how the P-legs and N-legs are connected in series in the egg-crate. The curved arrows e show the direction of electron flow from copper lead 1 through P-leg 2 to top conductor 4, N legs 6, bottom conductors 8, and P leg 2 top conductor 4 and N-leg 6 in this portion 10 of the module. Insulating walls 14 keep the electrons flowing in the desired series circuit. Other $Bi_2Te_3$ thermoelectric modules that are available at Hi-Z are designed to produce 2.5 watts, 9 watts, 14 watts and 20 watts at the 200° C. temperature differential as explained above. The term bismuth telluride is often used in the thermoelectric industry to refer to all combinations of $Bi_2Te_3$, $Bi_2Se_3$, $Sb_2Te_3$ and $Sb_2Se_3$. (This apparently is because antimony is chemically similar to bismuth and selenium is chemically similar to tellurium.) In this document where the term $Bi_2Te_3$ is used, it means any combination of $Bi_2Te_3$, $Bi_2Se_3$, $Sb_2Te_3$ and $Sb_2Se_3$.

Temperature Limitations

The egg-crates for the above described $Bi_2Te_3$ modules are injection molded using a thermoplastic supplied by Dupont under the trade name "Zenite". Zenite melts at a temperature of about 350° C. The thermoelectric properties of $Bi_2Te_3$ peak at about 100° C. and are greatly reduced at about 250° C. For both of these reasons, uses of these modules are limited to applications where the hot side temperatures are lower than about 250° C.

Thermoelectric Materials—Figures of Merit

Thermoelectric Materials

Many different thermoelectric materials are available. These include bismuth telluride, lead telluride, silicon germanium, silicon carbide, boron carbide and many others. In these materials relative abundance and doping ranges can make huge differences in the thermoelectric properties. Much experimental data regarding these materials and their properties is available in the thermoelectric literature such as the CRC Handbook referenced above. Each of these materials is rated by their "figure of merit" (Z) which in all cases is very temperature dependent. Despite the fact that there exists a great need for non-polluting electric power and the fact that there exists a very wide variety of un-tapped heat sources; thermoelectric electric power generation in the United States and other countries is minimal as compared to other sources of electric power. The reason primarily is that thermoelectric efficiencies are typically low compared to other technologies for electric power generation and the cost of thermoelectric systems per watt generated is relatively high compared to other power generating sources. Generally the efficiencies of thermoelectric power generating systems are in the range of about 5 percent.

Lead Telluride Modules

Lead telluride thermoelectric modules are also known in the prior art. A prior art example is the PbTe thermoelectric module described in U.S. Pat. No. 4,611,089 issued many years ago to three thermoelectric workers one of which is one of the present inventors. This patent is hereby incorporated herein by reference. That module utilized lead telluride thermoelectric alloys with an excess of lead for the N legs and lead telluride with an excess of tellurium for the P legs. Performance can be improved with doping using known techniques. The thermoelectric properties of heavily doped lead telluride thermoelectric alloys peak in the range of about 425° C. The egg-crate for the module described in the above patent was fabricated using a technique similar to the technique used many years ago for making chicken egg crates using cardboard spacers. For the thermoelectric egg-crate the spacers were mica which was selected for its electrical insulating properties at high temperatures. Mica, however, is marginal in strength and cracks easily. A more rugged high-temperature material is needed.

Figure 3A:
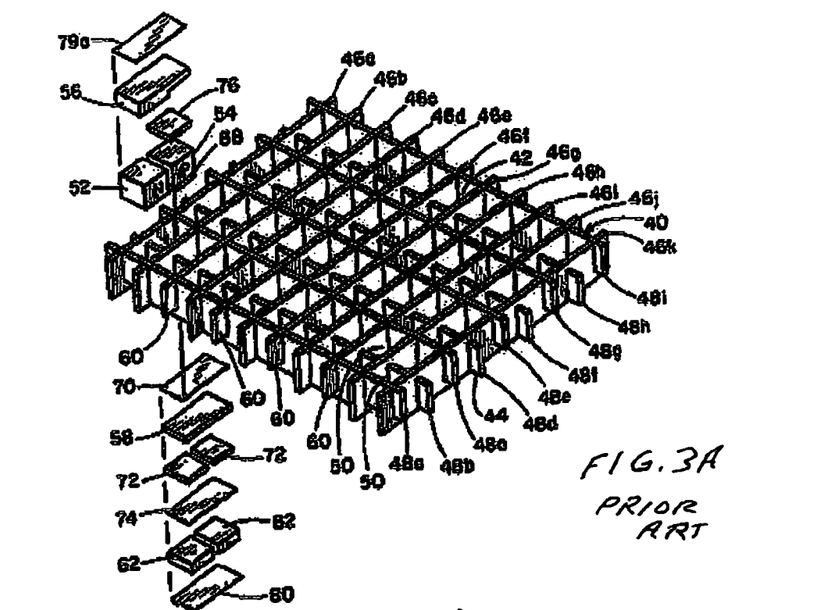
FIGS. 3A and 3B show views of a prior art PbTe module.
Figure 3B:
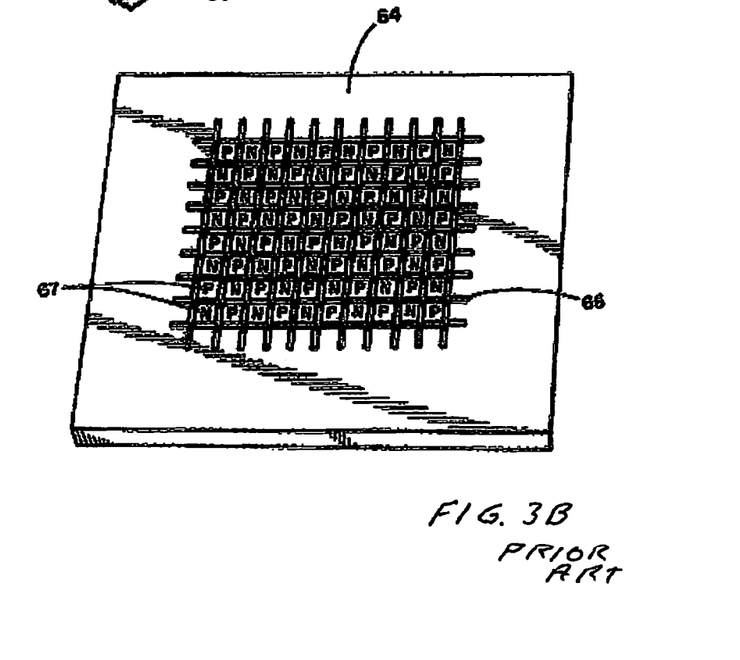

FIGS. 3A and 3B are drawings from the U.S. Pat. No. 4,611,089 patent showing a blow-up of the module described in that patent. The egg-crate included a first set of parallel spacers 46a to 46k and a second set of spacers 48a to 48i. The N legs are shown at 52 and the P legs are shown at 54. The module included hot side conductors 56 and cold side conductors 58 to connect the legs in series as in the $Bi_2Te_3$ module described above.

That lead telluride module was suited for operation in temperature ranges in excess of 500° C. But the cost of fabrication of this prior art module is greatly in excess of the bismuth telluride module described above. Also, after a period of operation of about 1000 hours some evaporation of the P legs and the N legs at the hot side would produce cross contamination of all of the legs which would result in degraded performance. Prior art thermoelectric modules have required special compression techniques applied to the modules to assure good electrical contacts with respect to the various segments of the thermoelectric legs.

Quantum Well Thermoelectric Modules

Quantum well thermoelectric modules are under development with possible efficiencies much higher than modules currently on the market. See for examples U.S. Pat. No. 6,828,579 and U.S. patent application Ser. No. 12/806,359. Efficiencies of these modules could be in the range of 20 to 30 percent or higher. Actual performance in these ranges has not yet been demonstrated on a commercial basis.

Thermoelectric Generator Design

FIG. 4 is a drawing showing views of a typical prior art thermoelectric generator. This unit was designed to produce electric power from the exhaust of a truck engine. In this design the hot exhaust gases exiting the engine are directed to pass through an octagonally shaped exhaust duct with fins on the inside to help transfer heat from the exhaust gasses to 72 thermoelectric modules mounted on the outside surface of the exhaust duct. The modules are compressed between the duct and 72 water cooled finned heat sinks with compression elements (not shown). With modules such as the HZ-14 the unit has produced close to about one kilowatt of electric power on a test cell and about 530 W produced when the TEG was installed on a truck when the coolant was about 90° C. One problem with the prior art design is that in operation, there is a substantial temperature drop in the exhaust gasses as they pass from the inlet of the duct to the outlet with the result that the modules near the outlet operate less efficiently than those at the inlet especially when the truck is idling or operating at low power. Another problem with this design is that on occasions electric power is needed when the truck is stationary. In this case operating the truck engine just to produce the electric power is extremely inefficient.

What is needed is a better thermoelectric generator especially for generating electric power from waste heat and from an alternate heat source when waste heat is not available.

SUMMARY OF THE INVENTION

The present invention provides a thermoelectric generator utilizing a number of thermoelectric modules to produce electric power from waste heat when waste heat is available and from an alternate heat source when waste heat is not available. In both cases hot gasses are directed along several separate paths so that all of the modules are provided with approximately equal hot side temperatures.

In preferred embodiments the thermoelectric generator includes a number of thermoelectric sub units positioned so as to create a plenum into which the waste heat in the form of a hot media is directed each of the thermoelectric sub units. Each sub unit includes a finned hot media duct defining a finned duct through which passes a portion of the hot media exiting the plenum, a heat sink, a number of thermoelectric modules sandwiched between the finned hot media duct and the heat sink, a compression element adapted to keep the duct, modules and heat sink in compression, and a hot media exhaust duct adapted to receive exhaust from the finned hot media duct. These generators include an auxiliary burner-blower unit adapted to force hot media into the plenum. The burner-blower unit includes a blower element and a burner element. These generators also include a generator control means adapted to control the operation of the thermoelectric generator utilizing the auxiliary burner-blower unit to permit electric power generation when the waste heat is not available.

In a preferred embodiment the engine exhaust exits into an octagonally-shaped plenum into eight separate heat exchangers. Eight modules are mounted in each of the heat exchangers for a total of 64 modules. A second embodiment utilizes heat exchangers that are about twice as long, each holding 16 modules for a total of 128 modules. Other embodiments utilize a square shaped plenum with four heat exchangers. With an exhaust temperature of about 450° C. from a 300 to 550 horsepower engine the hot side temperatures between the modules vary by less than 20 degrees (i.e. about 250° C. for the hottest to about 230° C. for the coolest). Preferred embodiments of the present invention include an auxiliary combustion burner-blower unit producing a hot exhaust that exits into the plenum to provide electric power when the truck is not operating. Valve features are provided to control the temperature and exhaust flow rate through the generator. The estimated increase in efficiency of the generated power from waste heat is from 10 percent to 15 percent compared to prior art systems for generating electric power from engine exhaust. The burner-burner unit increases the efficiency much more in comparison to idling the engine to produce electric power.

BRIEF DESCRIPTION OF THE DRAWINGS

FIGS. 5, 6 and 7A, B and C show how two sections of a finned hot duct are joined.

DETAILED DESCRIPTION OF PREFERRED EMBODIMENTS

Thermoelectric Generators

In the case the prior art generator shown in FIG. 4 the thermoelectric modules are assembled in series with respect to the heat flow. As a result, the heat carrying media exhibits temperature drop traveling from the first thermoelectric section to the last one. Depending on the capacity of the system, the hot side heat exchanger efficiency and the amount of energy the exhaust stream, the temperature differential between the exhaust inlet and outlet could vary over wide ranges.

In order to maximize the efficiency of the thermoelectric generator system when many of the same thermoelectric modules are being used, it is desirable to maintain as much as possible uniform temperature differential between the hot and cold sides of the thermoelectric modules. In addition, these temperature differentials should be close to the temperatures for which the modules are optimized.

If the thermoelectric generator capacity is much lower that the amount of the energy in the exhaust, it is possible to maintain the module hot side temperature differential in a narrow range with the generator design shown in FIG. 4. For example, in order to produce 1 kW with $Bi_2Te_3$ modules having efficiencies of about 5 percent, it is necessary to deliver to the modules about 20 kW of heat. If the generator is installed on a Diesel truck with a 550 horsepower engine, the amount of energy in the exhaust can reach about 400 kW so extracting 20 kW will not produce a substantial temperature drop along the length of the exhaust duct. However if the engine is only a 80 horsepower engine, if the 550 horsepower engine is only idling or if a 40 KW burner is used as a heat source for the generator; then in these cases, the temperature drop would be substantial.

The present invention provides an auxiliary combustion burner-blower unit that can be utilized to produce electric power if the truck is stationary. A preferred combustion burner-blower unit has a burner capacity of 40 KW using one gallon per hour of diesel fuel. With a hot-side heat exchanger efficiency of about 50 percent, the temperature drop along the axis of the prior art generator would be about 100 degrees.

In order to compensate this rapid temperature drop it would be possible to design the generator with a variable heat transfer area, increasing this area from the inlet to the outlet. This approach will result in more complicated and expensive unit, but still this system will be optimized for an "optimal window" of narrow operating parameters (exhaust temperature and flow rate). Beyond this optimal window the generator will exhibit large temperature non-uniformity and substantial backpressure. In addition, by increasing the heat transfer area from the each successive section, it is necessary to install more fins/pins, flow stream turbulizers or other components that reduce the thermoelectric generator open area and increase the system backpressure. The increased backpressure could adversely impacts engine performance as well as the burner power consumption.

Embodiments of the present invention are based on separating the major energy carrying stream into several paths, each path conveying a portion of the exhaust stream with the same temperature and flow rate to a dedicated thermoelectric sub-unit. This distributed energy delivery system can be very flexible with respect to design, capacity, and types of thermoelectric modules utilized.

First Preferred Embodiment

Figure 5:
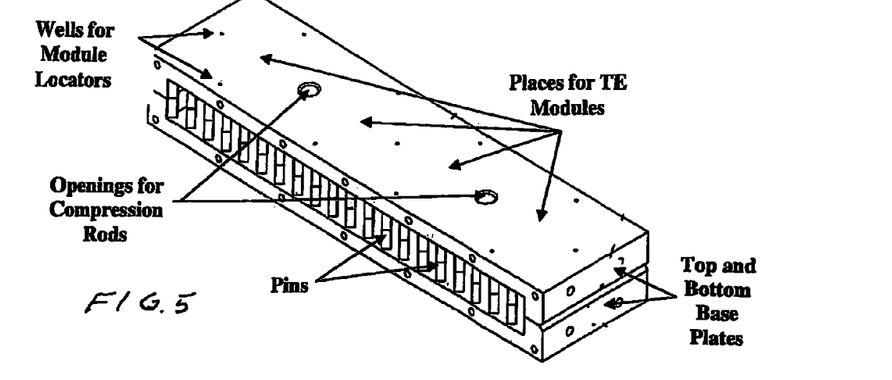
Figure 6:
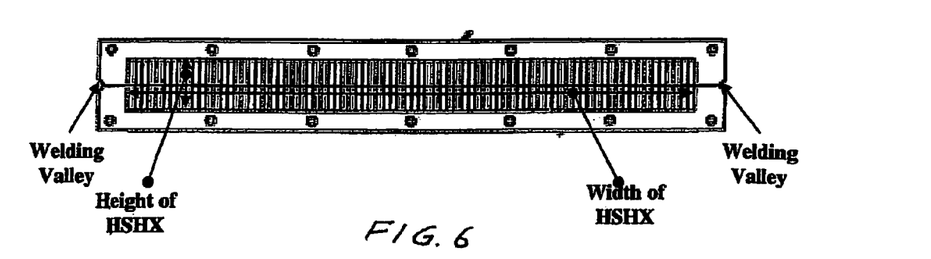
Figure 9A:
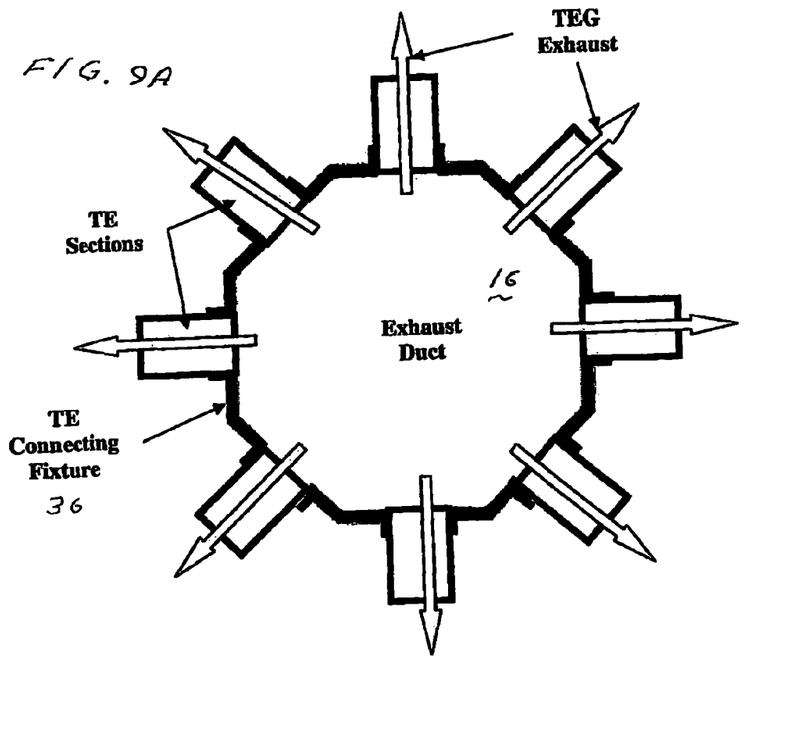
FIGS. 9A and 9B show how the parts shown in FIGS. 5 through 9B are assembled.
Figure 9B:
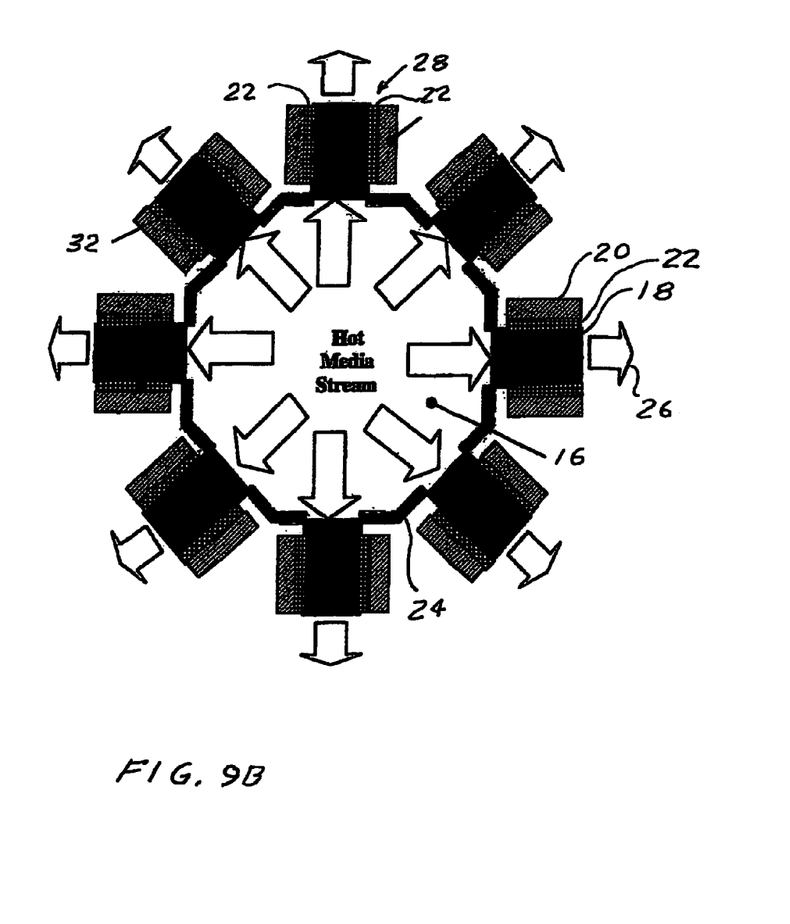

A drawing showing features of a first preferred embodiment of the present invention is presented in FIG. 9B. The hot media from a waste heat source (such as a truck engine) or a combustion burner-blower unit (engine or burner exhaust of other heat source) enters octagonally-shaped plenum 16. The hot media exits plenum in a plurality of streams each stream passing through one of eight finned hot media ducts 18 into one of eight exhaust ducts represented here by arrow 26. (In this first preferred embodiment the finned hot media ducts are each 12.5 inches long, 3¼ inches wide and 1¾ inch high and is pictured in FIG. 5. The cross-section of the finned passageway through the duct approximately is 1½ inch by 11½ inches as indicated in FIG. 6. Each hot media duct 18 provides space on each of two of its sides for four thermoelectric modules as shown in FIG. 5. So this thermoelectric generator contains 64 thermoelectric modules.)

Figure 8A:
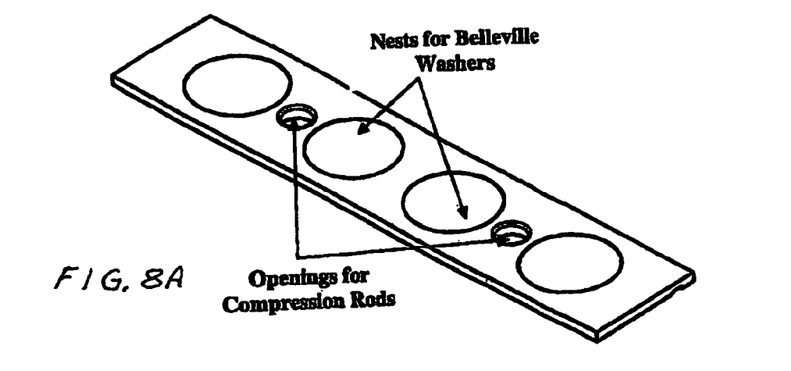
FIGS. 8A, 8B and 8C show how a water cooled heat sink is constructed.
Figure 8B:
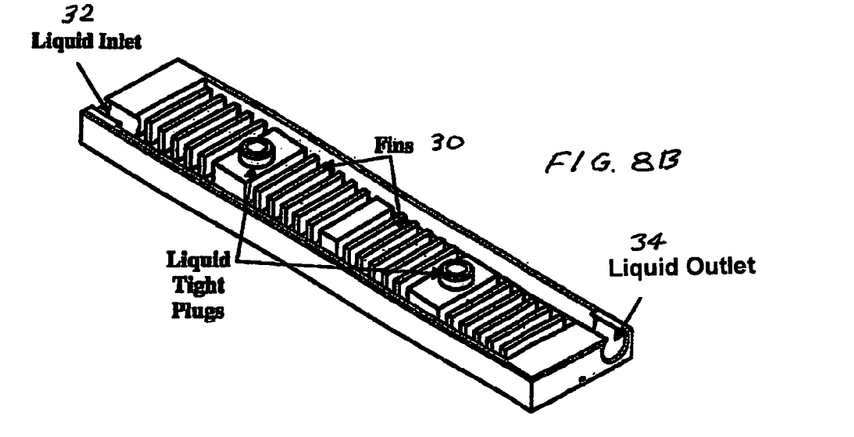
Figure 8C:
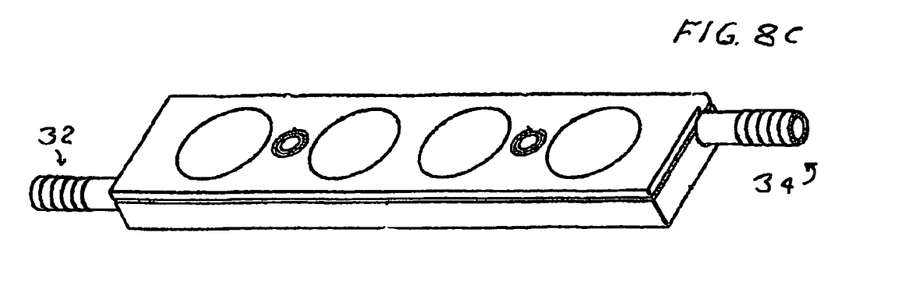

FIG. 9B is a cross section drawing showing eight thermoelectric sub-units 28. Each of the thermoelectric sub-units contain eight thermoelectric modules, two of which are shown in FIG. 9B at 22 as parts of thermoelectric sub-unit 28. The thermoesctric modules 22 are positioned on two sides of each finned hot media duct 18 and are sandwiched between the finned hot media duct 18 and a water cooled heat sink unit 20. The water cooled finned heat sink units are also 12½ inches long and 3¼ inches wide and are shown in FIGS. 8A, 8B and 8C. The fins are shown at 30 and the water inlet and outlet are shown at 32 and 34.

In preferred embodiments the finned hot media ducts as shown in FIGS. 5 and 6 are fabricated from stainless steel material. Each duct is fabricated in two parts and the two parts are welded together as shown in FIGS. 5 and 6. The fins are in the form pins with a ¼ inch square-shaped cross section. The fins are fabricated by machining a first set of parallel ½ inch deep grooves ¼ inch apart at 45 degrees with the length of the duct and then machining a second set of similar parallel ½ inch deep grooves at 90 degrees with the first set of grooves. When joined together the positions of the pins match as shown in FIG. 5 giving the pins a total length of about 1 inch.

In preferred embodiments the octagonally shaped plenum is created by connecting the eight finned hot media ducts with stainless steel spacers as shown at 36 in FIG. 9A and referred to as "TE Connecting Fixture". In this embodiment the spacers are the same length as the eight hot media ducts. The parts can be welded or bolted together with appropriate gaskets.

In the proposed thermoelectric generator design the hot exhaust will pass only one module located on both sides of the hot side heat exchangers so that all 64 modules are exposed to substantially the same hot side temperature. Under any conditions (exhaust gas temperature and flow rate) all the thermoelectric sections and thermoelectric modules will have similar inlet and outlet stream parameters that shall result in similar temperature profiles.

In addition to the mentioned above advantage, the proposed thermoelectric design is expected to display a significantly lower backpressure because of much shorter path of the exhaust gas and an easy manageable hot side open area. In the design that is presented in prior art FIG. 4 the exhaust gas has to path the distance approximately equal to the length of nine thermoelectric modules. In the thermoelectric generator of the present invention, the exhaust gas in each thermoelectric section passes the distance that is equal to the length of one module. The shape of the exhaust duct is not limited to octagonal; various shapes will work, including but not limited to cylindrical, square, hexagonal and other. In the above described unit the finned hot media ducts are 12½ inches long but obviously many other lengths could be utilized. For example Applicants have constructed a prototype unit in which the lengths of the ducts are doubled and each of eight thermoelectric subunits contain 16 modules for a total of 128 modules. Applicants have also constructed units with a square shaped plenum with only four thermoelectric subunits each containing eight modules for a total of 32 modules.

Figure 11:
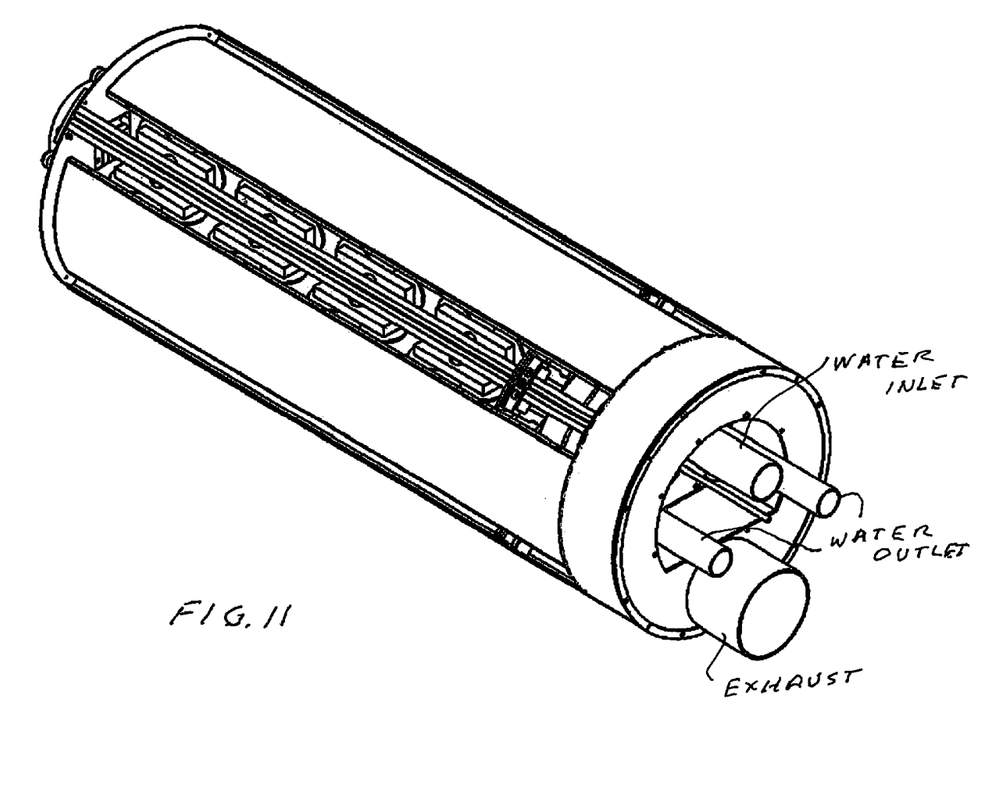
FIG. 11 show features of a 64 module thermoelectric generator for truck waste heat conversion.

FIG. is a drawing of a fully assembled 64 module generator showing some additional features including water inlet pipe 37, two water outlet pipes 38 an exhaust manifold 39 and an exhaust pipe 40.

Thermoelectric Modules

Preferred modules are commercially available $Bi_2Te_3$ modules (HZ-20, HZ-14 manufactured by Hi-Z Technology. The parameters of the HZ-14 modules are presented in Table 1.

TABLE 1

Properties of the 14 Watt Module, HZ-14

| | Value | | Tolerance | |
|---|---|---|---|---|
| Physical Properties | | | | |
| Width and Length | 2.47 in. | (6.27 cm) | ±0.005 | (0.25) |
| Thickness | 0.2 in. | (0.508 cm) | ±0.005 | (0.25) |
| Weight | 82 grams | | ±3 grams | |
| Compressive Yield Stress | 10 ksi | (70 MPa) | Minimum | |
| Number of active couples | 49 couples | | — | |
| Thermal Properties | | | | |
| Design Hot Side Temperature | 230° C. | (450° F.) | ±10 | (20) |
| Design Cold Side Temperature | 30° C. | (85° F.) | ±5 | (10) |
| Maximum Continuous Temperature | 250° C. | (480° F.) | — | |
| Minimum Continuous Temperature | None | | — | |
| Maximum Intermittent Temperature | 400° C. | (750° F.) | — | |
| Thermal Conductivity[1] | 0.024 W/cm*K | | +0.001 | |
| Heat Flux[1] | 9.54 W/cm$^2$ | | ±0.5 | |
| Electrical Properties (as a generator)[1] | | | | |
| Power[2] (typically ≥ 14 Watts) | 14 Watts | | Minimum | |
| Load Voltage | 1.65 Volts | | ±0.1 | |
| Internal resistance | 0.15 Ohms | | ±0.05 | |
| Current | 8 Amps | | ±1 | |
| Open Circuit Voltage | 3.5 Volts | | ±0.3 | |
| Efficiency | 4.5% | | minimum | |

[1]At design temperatures
[2]At matched load, please refer to the graphs for properties at various operating temperatures and conditions.

Figure 10A:
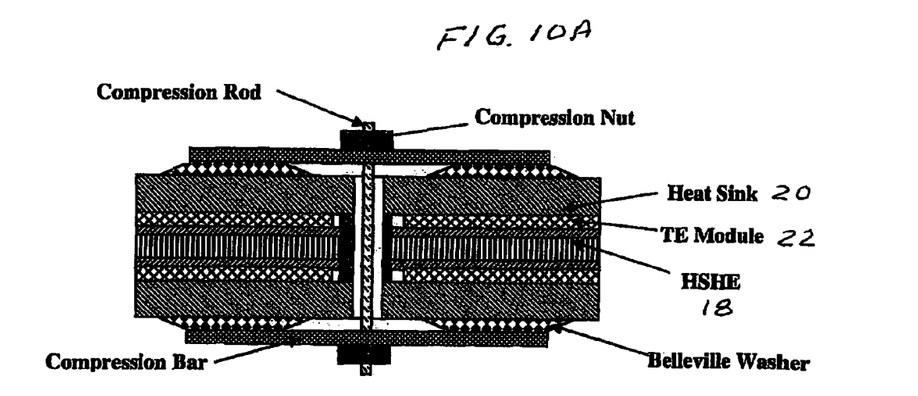
FIGS. 10A and 10B show how thermoelectric modules are held in compression.
Figure 10B:
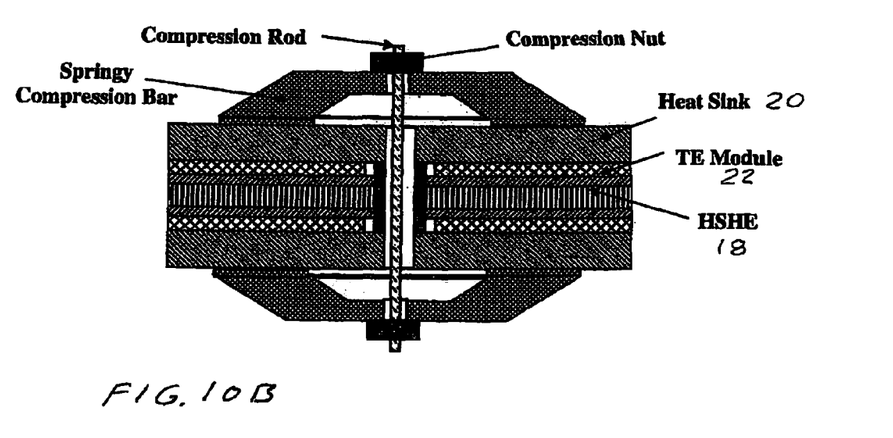

The TE modules are sandwiched between the hot side heat exchanger and cooling heat sinks and compressed at about 200 psi to ensure a good heat transfer and reliable mechanical integrity of the TE section. Two alternate techniques for creating the sandwiches are shown in FIGS. 10A and 10B. In the FIG. 10A example Bellville washers are used for compression and rods and nuts are used and in the FIG. 10B example spring type brackets are used.

A second set of preferred thermoelectric modules are segmented PbTe/Bi$_2$Te$_3$ modules that are capable of operating at higher hot side temperature (~550° C.), while maintaining the cold side temperature at the level of Bi$_2$Te$_3$ modules. These are described in U.S. patent application Ser. No. 12/317,608. This causes much larger hot/cold side temperature differential with an associated gain in module efficiency (~up to 10%) and power production.

A third set of preferred thermoelectric modules could be high efficiency quantum well (QW) modules that are currently under development by Hi-Z Technology Inc. and referred to in the background section. These modules will be fabricated from nanostructured multi-layered materials, for example from the alternating layers of Si/SiGe or other suitable materials. The thickness of the individual layer is about 10 nm with the total QW stack thickness between 2 and 11 um.

Finned Hot Media Ducts

The preferred finned hot media duct is assembled from two mirror parts welded together as explained above, so they are forming a strong structure as shown in FIGS. 5 and 6. In order to provide efficient heat transfer the pins are machined from the metal plates. Both halves of the heat exchanger come together in such a way that the pins of the both side are touching each other and the two sides are welded together along the two sides.

Figures 7A, 7B:
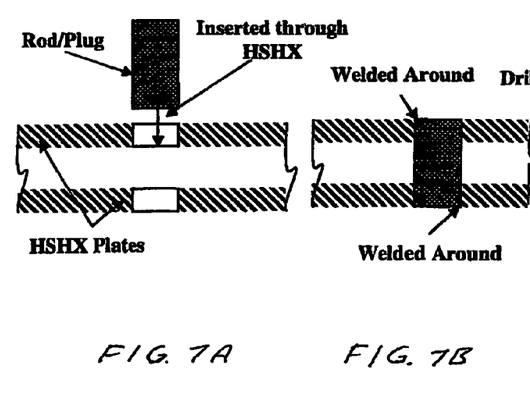
Figure 7C:
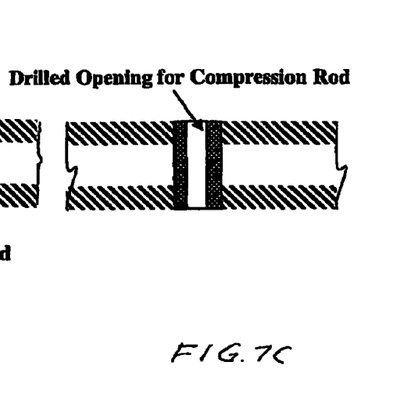

In order to have a gas tight heat exchanger with respect to the compression system, the openings are plugged with rods, rods are welded around both sides and a new opening is drilled to allow the compression rod to go through as shown in FIGS. 7A, B and C (heat transfer pins are not shown in this figure). Finally, the duct is machined to a desired flatness from the both sides in order to ensure flat and parallel surfaces for mounting the thermoelectric modules. A set of wells for the thermoelectric modules locators is drilled on the each side of the generator. The module locators (small pins ensure modules secure position in the generator section during and after assembly.

The duct can be fabricated from different materials, depending on the thermoelectric modules integrated into the system. For a preferred embodiment the hot side heat exchanger is fabricated from aluminum, which exhibits reasonable thermal conductivity (~160 W/m° C.), light weight (2.7 g/cm$^3$) very good machinability and low cost, but aluminum can not be use for high temperature applications.

For a second (high temperature operation) embodiment the hot side heat exchanger can be fabricated from steel, capable of withstanding about 550° C., which is compatible with the requirements for the PbTe and quantum well thermoelectric modules.

Cooling Heat Sink

The preferred cooling heat sink utilizes the heat sink design that is schematically presented in FIGS. 8A, B and C as explained above. The heat sink consists of two major components: a base and a cover. The base is designed to accommodate four thermoelectric modules on the outer surface of the base. A set of fins is machined on the internal side of the base (above the section that is adjacent to each module) in order to improve heat transfer. An inlet and outlet water channels are tempered in order to provide for uniform water flow above the each module. The cooling water enters the inlet channel via an inlet fitting, travels across the fins above the each module and is collected in the outlet channel that rejects the water through the outlet fitting. The complete heat sink assembly is presented in FIG. 8C. In preferred embodiments in which the thermoelectric generator is used to convert motor vehicle engine exhaust into electricity water for cooling the heat sink is provided by the vehicle water cooling system. Applicant has determined that typical motor vehicle cooling systems normally have excess capacity to handle the extra capacity to handle the extra heat load. However, instrumentation should be provided that would permit the exhaust to bypass the hot media ducts in the event the engines water temperature gets too hot.

A preferred material for the cooling heat sinks is aluminum. The other materials, such as copper, various metal alloys, composite materials or a combination of above can be used for cooling heat sinks fabrication.

A second preferred cooling heat sink can be made from the two welded mirror parts similar to the hot side heat exchanger. Also a variety of other cooling heat sinks can be employed in preferred embodiments of the present invention. Forced air, natural convection and liquid cooling heat sinks, heat pipes or other can be integrated into this device.

A third cooling heat sink can be made from heat pipes. An evaporator of the heat pipe shall be adjacent to the cold side of the thermoelectric module trough electrically non-conductive materials and the condenser of the heat pipe can be cooled by air or liquid depending on the generator design and applications.

A fourth cooling heat sink can be equipped with water flow turbulizers in order to intensify heat transfer.

Other Features

The inlet section of the exhaust duct is attached to a waste heat source. The other end of the exhaust duct can be blocked directing the entire exhaust stream through the thermoelectric sections. The exhaust gas that exits the thermoelectric section can be released in atmosphere or collected by a set of exiting exhaust ducts and conveyed in the desired location.

A first preferred material choice for the exhaust duct is a stainless steel, which is capable for a long-term operation in combustion exhaust environment (high temperature, corrosive gases). The other materials, such as passivated carbon steel (inexpensive), titanium (light weight), aluminum (low cost, light weight) if the temperature of the exhaust duct does not exceed 250° C.), various alloys, ceramic or composite materials can be also employed in the exhaust duct Other exhaust ducts can be designed with different than octagonal shaped structure. It can be hexagonal, cylindrical, square or other configurations depending on application, space constrains, generator capacity and other considerations.

Auxiliary Heat Source

Figures 13A, 13B, 13C:
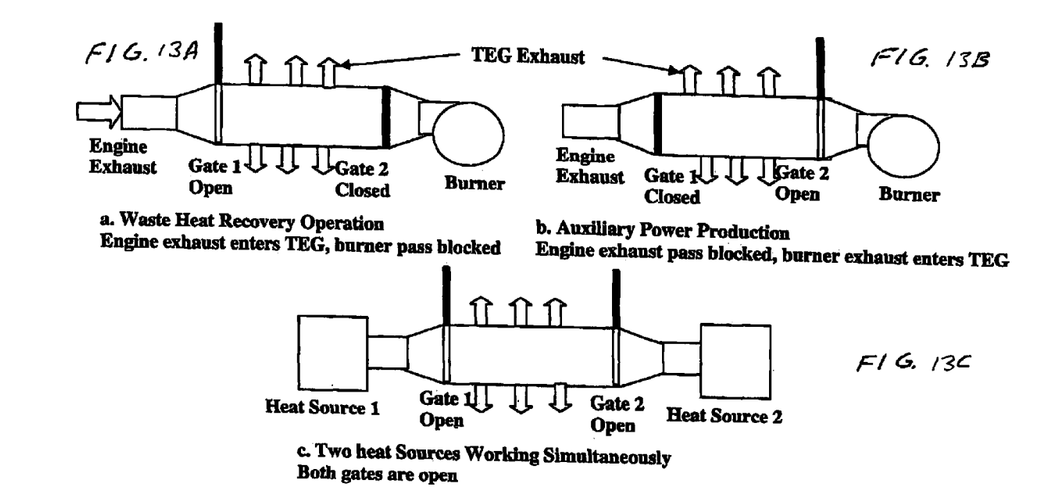
FIGS. 13A through 13D show techniques for controlling output of the thermoelectric generator.

In preferred embodiment the generator operating with waste heat also has a burner that is attached on the back side of the generator opposite the waste heat inlet. The waste heat inlet and the burner exhaust inlets are equipped with the gates that alloy to the exhaust to enter the exhaust duct or blocking the entrance. When engine is operational (in this case the gate that separates the exhaust duct from the engine exhaust duct is open, the other gate that separates the exhaust duct from the burner is closed as shown in FIG. 13A. The engine exhaust passes the generator (without interfering with the burner) and the system works in a waste heat recovery mode. If the burner is working and the engine is off (FIG. 13B) gate 1 is blocked and the gate 2 allows the burner exhaust entering the generator. In some cases (for both waste heat recovery and auxiliary power applications) two heat sources can supply energy to the system as shown in FIG. 13C.

Low Power Consumption Blower-Burner

In order to design and fabricate efficient thermoelectric generators it is necessary to minimize as much as possible parasitic losses. Parasitic losses include power required for a burner start and operation, electric power that is consumed by cooling fans, coolant pumps and controls.

Also, it is preferable to utilize DC powered electrical components that can be directly powered by the thermoelectric generator, eliminating needs for a DC/AC inverter, which introduces additional parasitic losses.

Existing commercial liquid fueled DC powered burners capable of delivering approximately 40 kW of heat consume significant amount of electrical power and cannot be employed in efficient blower-burner unit. For example, a DC liquid fuel burner manufactured by Beckett Corporation, Model ADC Oil Burner 12V or 24 V, capable of producing from 30 to 100 kW of heat requires from 325 to 420 W for operation as shown in the burner specification. Taking into account that the unit should produce about 1 kW of gross electric power, the parasitic losses from this burner will account for ~32 to 42% of the gross power production.

In order to minimize the burner parasitic losses Applicant invented a novel liquid fueled burner that delivers about 40 kW of heat to the APU with the power consumption of about 20 W that accounts only for about 2% of the gross electric power production.

The major burner components are as follow:

1. A fuel pump: the preferred embodiment employs the fuel pump manufactured by Flight Works, Inc., model 100-C (specification is attached). This pump is capable of delivering liquid fuel up to 400 ml/mil at maximum pressure of 70 psi (the backpressure of APU when the burner is used as a heat source does not exceed 0.1 psi). The pump starts operating at about 1 VDC and the maximum input voltage shall not exceed 7.2 V. The fuel pump supplies liquid fuel to the burner atomizer.

2. An air pump: the preferred embodiment employs the air pump manufactured by SmartProducts, Model # SP-8000 (specification is attached). This pump is capable of delivering up to 8.5 cfh of air or 0.035 cfm at 14.5 psi. The pump operates at 12 and 24 VDC. The air pump supplies a pressurized air to a burner nozzle to atomize liquid fuel prior combustion.

3. A combustion blower: the preferred embodiment employs the blower manufactured by EMBPAPST, Model #RG 100/1100-2012. This blower operates at 24 VDC and capable of supplying up to 30 cfm of air. The combustion blower supplies air to the burner for further mixing with the atomized fuel for ignition and combustion. This blower exhibits very low power consumption, which does not exceed 20 W at maximum load. The other blowers of the same manufacturers (such as RG100, RG128, RG130, and RG148) or similar can be used for APU applications.

Figure 12:
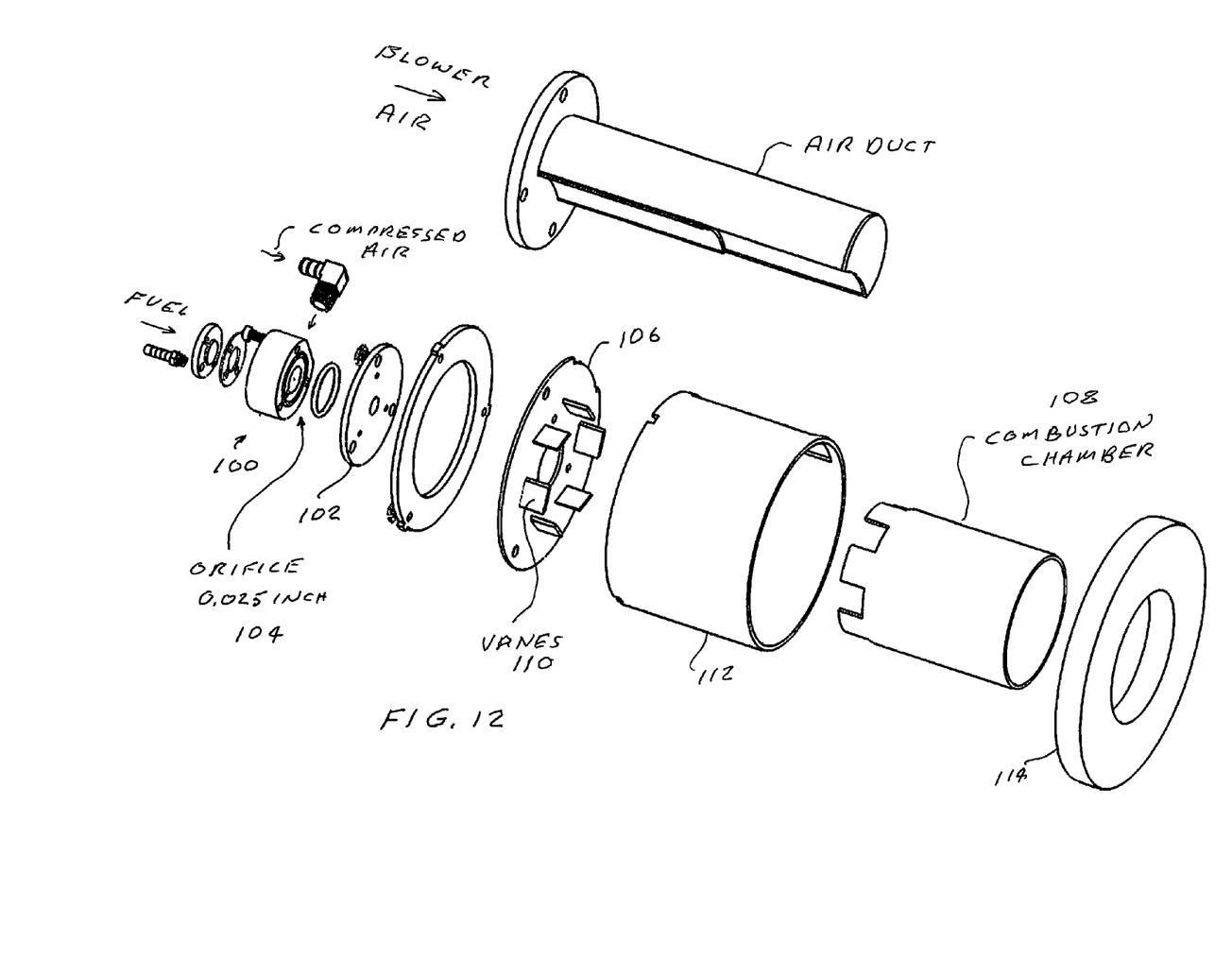
FIG. 12 shows features of a preferred blower-burner unit.

4. Burner nozzle. The burner nozzle shown in FIG. 12 at consists of a fuel/compressed air chamber 100 and a front plate 102 with an orifice 104 and a back plate 106. Liquid fuel and compressed air are entering the fuel/compressed air chamber as shown in FIG. 12, which is designed as a very shallow cavity between the fuel/compressed air chamber and the front plate. Liquid fuel supplied by the fuel pump enters the shallow cavity and creates a very thin fuel film that can be easy broken by the slightly pressurized air in the front plate orifice. The pressurized air delivered by the air pump breaks the fuel film and fine atomized fuel with a small amount of compressed air enters a burner mixing/combustion chamber where it is ignited by the means of an igniter (not shown).

5. A mixing/combustion chamber. The mixing/combustion chamber is formed by the burner back plate and cylindrical section 108 attached to the back plate. The cylindrical chamber equipped with the air ports in a section that is adjacent to the back plate. The back plate is equipped with vanes 110 that tangentially introduce incoming air into the mixing/combustion chamber.

6. A burner shell. The burner shell 112 surrounds the mixing/combustion chamber allowing the combustion air that is supplied by the combustion blower via an air duct to flow around the mixing/combustion chamber until the combustion air enters the mixing/combustion chamber via the ports with the tangential vanes. The cylindrical section of the burner shell is attached to the burner back plate. The burner is also equipped with front plate 114 that is attached to the combustion chamber.

Burner Operation

The fuel and compressed air enters the burner nozzle and the compressed air atomizes liquid fuel in the front plate orifice. The atomized fuel and small amount of air entering the mixing/combustion chamber and mixing with the combustion air that is supplied by the combustion blower via the air duct. The tangential vanes force the combustion air to create a vortex that assist mixing fuel and air. The fuel/air mixture ignites by the burner igniter. The flame propagates along the burner axis and enters the burner combustion chamber. The hot side temperature of the thermoelectric generator is controlled by the burner firing rate and the excess air. The burner firing rate and the excess air are controlled by the fuel pump, air pump and combustion blower input voltages.

Generator Controls

Figure 13D:
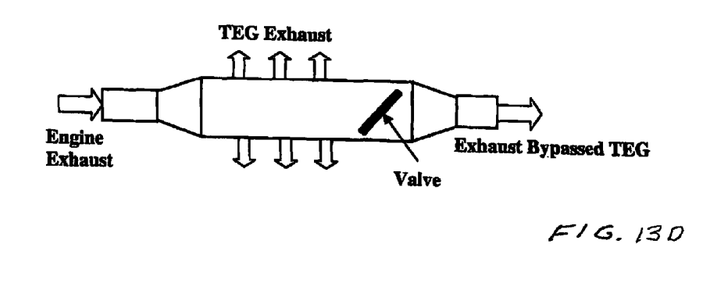

In a variation as shown in FIG. 13D the opposite end of the exhaust duct is equipped with the valve that manages amount of heat that is conveyed to the system and bypasses the rest of the energy. This system can be useful to manage the thermoelectric module hot side temperature. For example, $Bi_2Te_3$ thermoelectric modules should not be subjected to hot side temperature above 250° C. If such a system is installed in the vehicle exhaust tail pipe and under engine heavy load and the hot side temperature reaches 250° C., a feedback loop can send a signal and the valve partially opens, allowing part of the exhaust to bypass the generator. The possibility of exhaust bypassing can be useful for the two important features:
1) maintain the TE modules at secure temperature that ensure a long TEG life, and
2) manage the exhaust backpressure that improves engine performance.

The exhaust duct can be designed in a such way that there is no a separate structure and the duct is formed by a set of the thermoelectric sections and special components (connecting fixtures) that are connected together as shown in FIG. 9A.

Compression System

In preferred embodiments a compression system is as presented in FIGS. 10A and 10B. The compression system for a set of four modules comprises of a completely or partially threaded compression rod, two compression bars, four Belleville washers and two compression nuts. After the thermoelectric section components are aligned the compression rod is inserted through the entire thermoelectric section via the liquid and gas tight openings in the cooling heat sinks and the hot side heat exchanger. The appropriate Belleville washers are positioned in the nests in the cover section of the heat sink and the compression bar is placed on the top of the Belleville washers. The compression bar position is secured by the compression nut and the same procedure is repeated on the other side of the thermoelectric section. The pressure (usually about 200 psi) is applied by tightening of the compression nut to achieve the design deflection of the Belleville washers.

In a second approach the compression system dose not use the Belleville washers, but utilizes the springy compression bars fabricated from tempered steel as displayed. A compression force is applied by tightening the compression nuts to achieve the calculated (measured) deflection of the compression bars. Other springy metals could be used.

High Efficiency Operation

The thermoelectric generator can operate with a single heat source or dual heat sources. For example, the unit is integrated into a vehicle exhaust pipe and equipped with an auxiliary burner on the other side of the unit. The engine exhaust and the burner exhaust entrance ports are equipped with the gates to block the exhaust steam from each source as described earlier.

The generator is design to produce the specific amount of electric power when it is driven by the burner exhaust. By tuning the burner combustion parameters (fuel rate, excess air) it is possible to adjust the hot side temperature to maintain the optimal hot/cold side temperature differential. The optimal $\Delta T$ depends on thermoelectric material and module geometry and a heat flux available. This system will produce the designed power output because the burner parameters can be adjusted independently from a driving cycle.

When the unit is operating in the waste heat recovery mode (driven by the engine exhaust), the temperature drop will be dependent on the driving cycle, so the thermoelectric efficiency can deviate from the optimal level compared to the burner driven mode.

In the waste heat recovery mode the unit will produce electric power that saves fuel and reduces pollutant emissions, in auxiliary mode the unit will produce electric power in optimal regime, consuming significantly less fuel compared to the engine waste heat recovery mode.

The auxiliary operation is beneficial when electric power shall be produced when the engine is not running, for example to run truck's accessories (lights, climate controls, TV, etc.) in places where idling is prohibited by law. Another auxiliary use for example military application, can provide for a silent electric power generation capabilities.

Other Advantages and Embodiments

Still other advantages and embodiments will become readily apparent to those skilled in this art from the above recited detailed explanations. Accordingly the above descriptions and the drawings should be considered as examples. Therefore, the scope of this invention should be determined by the appended claims and their equivalents.

Variations

Although the present invention has been described above in terms of preferred embodiments, persons skilled in the thermoelectric arts will recognize that many other changes and variations are possible within the general concepts of the present inventions. Therefore the scope of the present invention will be determined by the appended claims and their legal equivalents.

What is claimed is:

1. A thermoelectric generator for producing electric power from waste heat said generator comprising:
   A) a plurality of thermoelectric sub units positioned so as to create a plenum into which the waste heat in the form of a hot media is directed each of plurality of thermoelectric sub units being comprised of:
      1) a finned hot media duct defining a finned duct through which passes a portion of the hot media exiting the plenum,
      2) a heat sink, 3) a plurality of thermoelectric modules sandwiched between the finned hot media duct and the heat sink,
4) a compression element adapted to keep the duct, modules and heat sink in compression
5) a hot media exhaust duct adapted to receive exhaust from the finned hot media duct,
B) an auxiliary burner-blower unit adapted to force hot media into the plenum said burner-blower unit comprising:
1) a blower element and
2) a burner element,
C) a generator control means adapted to control the operation of the thermoelectric generator utilizing the auxiliary burner-blower unit to permit electric power generation when the waste heat is not available.

2. The thermoelectric generator as in claim 1 wherein the plenum has an approximately octagonal cross-section and the plurality of finned hot media ducts is eight finned hot media ducts.

3. The thermoelectric generator as in claim 1 wherein the plenum has an approximately hexagonal cross-section and the plurality of finned hot media ducts is six finned hot media ducts.

4. The thermoelectric generator as in claim 1 wherein the plenum has an approximately square cross-section and the plurality of finned hot media ducts is four finned hot media ducts.

5. The thermoelectric generator as in claim 1 and also comprising a plurality of spacers wherein the plenum is created by connecting the plurality of finned hot media ducts and the plurality of spacers.

6. The thermoelectric generator as in claim 5 wherein the parts are connected by welding them together.

7. The thermoelectric generator as in claim 5 wherein the parts are connected by bolting them together.

8. The thermoelectric generator as in claim 1 wherein the heat sink is a water-cooled heat sink.

9. The thermoelectric generator as in claim 1 wherein the compression elements are comprised of Bellville washers.

10. The thermoelectric generator as in claim 1 wherein the compression elements are comprised of a compression rod and at least one compression nuts and a springy compression bar.

11. The thermoelectric generator as in claim 1 wherein the burner-blower unit is power by direct current electric power.

12. The thermoelectric generator as in claim 1 wherein the burner-blower unit comprises a nozzle unit, a combustion chamber, a fuel pump, an air pump providing compressed air to said nozzle unit, a combustion air blower.

13. The thermoelectric generator as in claim 12 wherein the nozzle unit comprising a tiny orifice is adapted to produce a fine spray of fuel and air as a result of quick expansion of the compressed air through the tiny orifice.

14. The thermoelectric generator as in claim 13 wherein the tiny orifice has a diameter of about 0.025 inch.

* * * * *